United States Patent [19]

Nakasuji et al.

[11] 4,346,325
[45] Aug. 24, 1982

[54] ELECTRON GUN

[75] Inventors: Mamoru Nakasuji, Yokohama; Hirotsugu Wada, Machida, both of Japan

[73] Assignee: VLSI Technology Research Association, Japan

[21] Appl. No.: 134,677

[22] Filed: Mar. 27, 1980

[30] Foreign Application Priority Data

Mar. 31, 1979 [JP] Japan .................................. 54-38546

[51] Int. Cl.$^3$ .......................... H01J 1/16; H01J 19/10
[52] U.S. Cl. .................................. 313/336; 313/346 R
[58] Field of Search ........................ 313/336, 337, 346

[56] References Cited

U.S. PATENT DOCUMENTS

| | | | |
|---|---|---|---|
| 4,054,946 | 10/1977 | Ferris et al. | 313/346 R |
| 4,055,780 | 10/1977 | Kawai et al. | 313/346 R |
| 4,137,476 | 1/1979 | Ishii et al. | 313/346 |
| 4,200,555 | 4/1980 | Joy et al. | 313/346 R |
| 4,258,283 | 3/1981 | Brunger | 313/346 R |
| 4,260,525 | 4/1981 | Olsen et al. | 313/346 R |

FOREIGN PATENT DOCUMENTS

| | | | |
|---|---|---|---|
| 603005 | 2/1975 | France | 313/336 |
| 52-30151 | 3/1977 | Japan | 313/336 |
| 55088233 | 12/1978 | Japan | 313/336 |

Primary Examiner—Saxfield Chatmon, Jr.
Attorney, Agent, or Firm—Finnegan, Henderson, Farabow, Garrett & Dunner

[57] ABSTRACT

An electron gun for a shaped beam type electron beam delineating system is provided with a cathode which is prepared from a single crystal of lanthanum hexaboride (LaB$_6$) the convex end portion of which has a tip radius ranging between 260 and 1,000 microns. The electron gun of the invention has a long effective life for producing a stable electron beam which can irradiate a limiting aperture with a uniform current density and insures the sufficiently high brightness of the electron beam image projected on a target.

3 Claims, 4 Drawing Figures

FIG. 1
FIG. 2
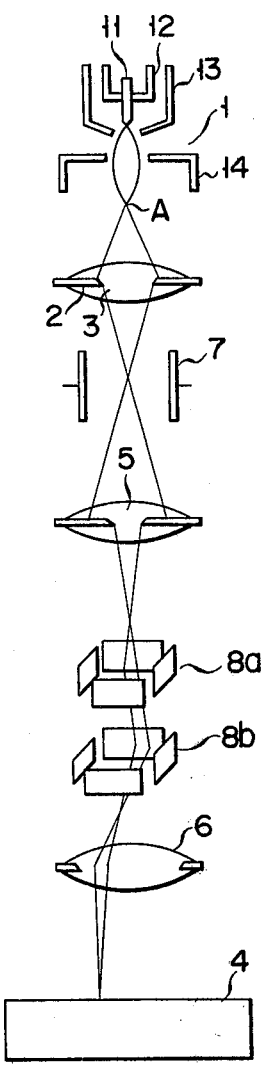
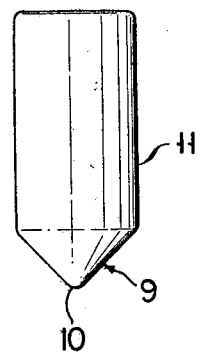

ELECTRON GUN

This invention relates to an electron gun adapted for use with a shaped beam type electron beam delineating system, wherein a cross section of an electron beam is shaped by passing the beam through a limiting aperture and projecting an image formed at aperture onto a target in a form contracted by an electron lens.

With this type of electron beam delineating system the electron beam emitted from an electron gun must irradiate the limiting aperture with a uniform intensity or current density. Where an exposing process is carried out using an electron beam whose cross section has been shaped by such a limiting aperture, it is necessary to use a large brightness current gun in order to increase a current density on the target.

The conventional electron beam apparatus is generally provided with an electron gun having a tungsten filament cathode. Where the tungsten filament cathode is used, a uniform current density is obtained, however, the image projected on a target has a low brightness as about $1 \times 10^5 (A/cm^2 \text{ str})$ at most. Moreover, the tungsten filament cathode has as short an effective life as about 100 hours, presenting difficulties in producing a stable electron beam over a long period of time.

Another known electron beam apparatus is the crossover reduction type electron beam projecting system, which causes an image produced at a crossover point to be projected on a target in the a form contracted by an electron lens, and which is provided with an electron gun having a cathode prepared from a single crystal of lanthanum hexaboride ($LaB_6$). With this type of electron gun, the cathode tip radius is chosen to less than 10 microns in order to elevate the current density of an electron beam projected on a target. Such a small cathode tip radius, however, fails to produce an electron beam which irradiates the limiting aperture with a uniform current density. Therefore, such a type of electron gun is unsuitable for use with a shaped beam type electron beam delineating system, and great difficulties have hitherto been experienced in producing an electron beam apparatus having the full advantages of a shaped beam type electron beam delineating system which enables the cross sectional form of an electron beam to be freely shaped.

It is accordingly the object of this invention to provide an electron gun capable of producing a stable electron beam over a long period of time and adapted for use with a shaped beam type electron beam projecting system so arranged as to cause the cross section of the electron beam to be shaped by a limiting aperture, wherein the electron beam irradiates the limiting aperture with a uniform current density, and in which an electron beam is projected on a target with sufficiently high brightness; and can produce a stable electron beam over a long period of time.

Toward this end, the present invention employs an electron gun which is provided with a cathode prepared from a single crystal of lanthanum hexaboride ($LaB_6$) whose convex end portion has a tip radius of 260 to 1,000 microns.

This invention can be more fully understood from the following detailed description when taken in conjunction with the accompanying drawings, in which:

FIG. 1 is a schematic diagram of a shaped beam type electron beam delineating system embodying this invention;

FIG. 2 is an enlarged view of a cathode to be used with the system of FIG. 1;

Figure 3:
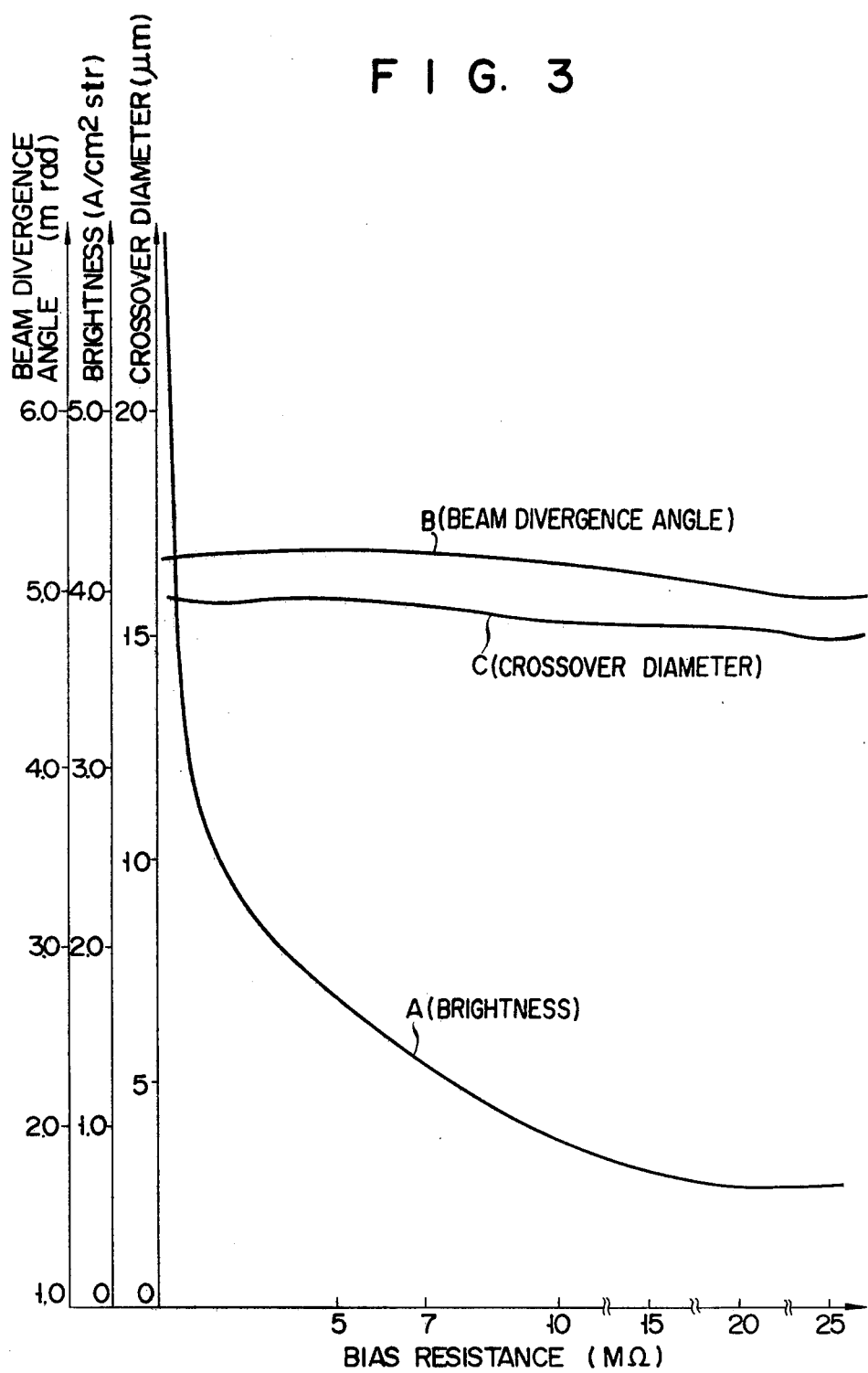
Figure 4:
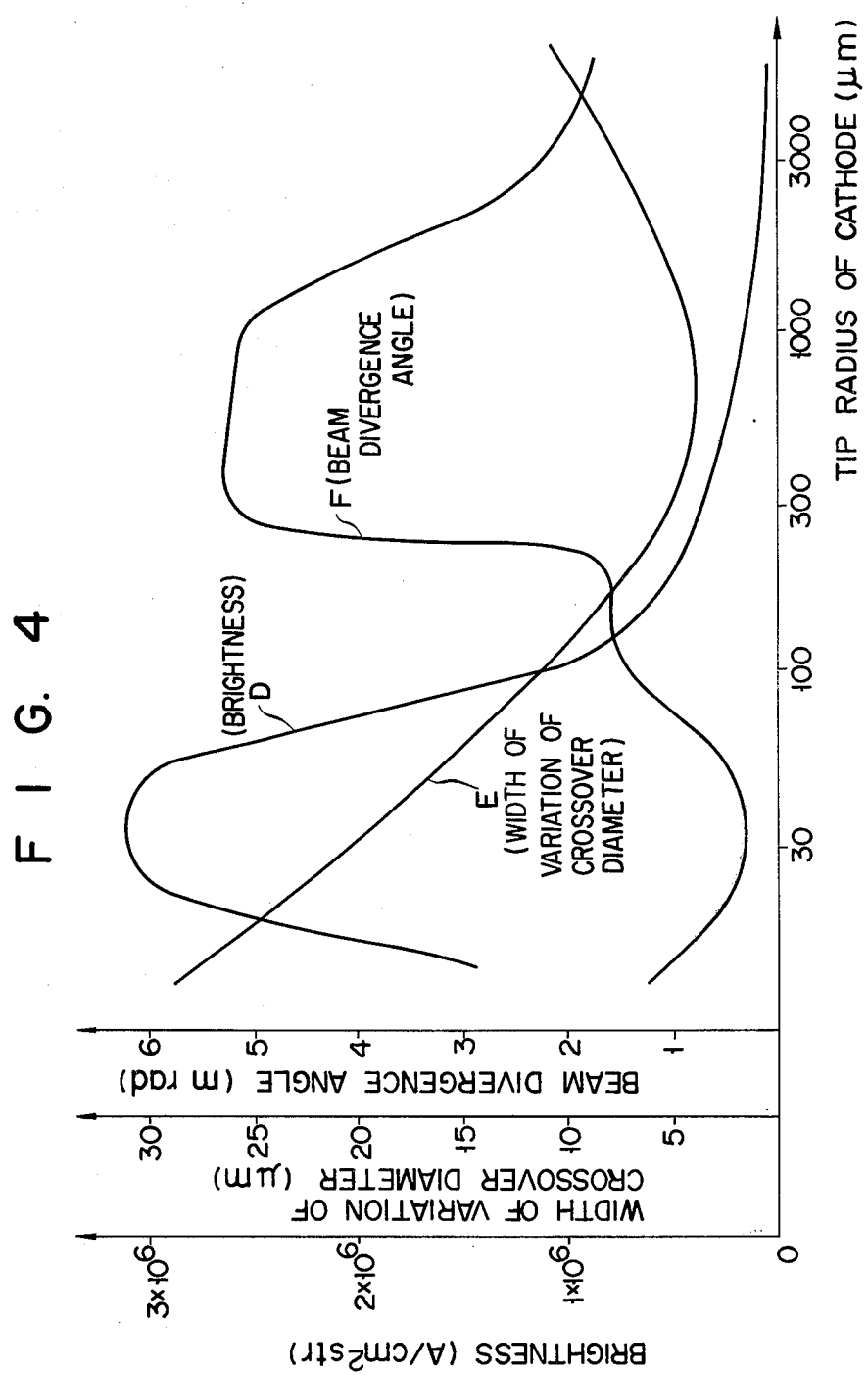

FIG. 3 graphically shows the dependency on the bias resistance of the brightness of an electron beam image, beam divergence angle and crossover diameter related to an electron gun embodying this invention; and FIG. 4 graphically indicates how the brightness of an electron beam image, the beam divergence angle and variations in the crossover diameter all related to the electron gun of this invention depend on the tip radius of the convex end portion of the cathode.

This invention is based on the discovery that it is advisable to employ a cathode which is prepared from a single crystal of lanthanum hexaboride ($LaB_6$) and which can emit an electron beam having a large beam divergence angle and a long crossover diameter in order to irradiate the limiting aperture and the target of a beam shaped type electron beam projecting system with an electron beam having a uniform and high current density; and that toward this end, the tip radius of said cathode should fall within the range of 260 to 1,000 microns.

A description will now be given of an electron gun embodying this invention with reference to the accompanying drawings.

FIG. 1 is a schematic diagram of an electron beam apparatus. An electron gun 1 comprises a cathode 11 which as seen in FIG. 2, is prepared from a single crystal of lanthanum hexaboride ($LaB_6$) whose end portion 9 and has a convex curved surface 10, a heater 12 for heating the cathode 11 an, anode 13, and a Wehnelt electrode 14. An electron beam emitted from the electron gun 1 is irradiated through a crossover point A onto a limiting aperture 3 concentrically disposed with a condenser lens 2. An image formed at the limiting aperture 3 is projected on a target 4 in contracted form by passing through an electron lens system consisting of a second condenser lens 5 an objective lens 6. Along the course of the electron beam is a deflection control system consisting of a blanking deflection plate 7, and scanning deflection plates 8a, 8b. The deflection control system causes the electron beam to scan the portions of the target 4 on which irradiation is desired. The convex curved surface 10 of end portion 9 of the cathode 11 has a crystal orientation of $<110>$ and a tip radius of 260 to 1,000 microns, but more preferably 300 to 600 microns. A cathode 11 thus constructed will emit an electron beam with a divergence angle in excess of 3 mrad and a crossover diameter of about 15 microns at the crossover point A, thereby enabling an electron beam to be projected on the target 4 with as high a brightness as about $2 \times 10^5$ to $7 \times 10^5$ $A/cm^2$ str. Further, the use of cathode 11 results in an electron gun having such stable properties that the beam divergence angle and crossover diameter vary little with the changes in bias resistance, and only the brightness of the electron beam image projected on a target varies with said bias resistance. Moreover, the cathode 11 produces a stable electron beam in which the above-mentioned properties vary little with the shape of the Wehnelt electrode 14 or with distance between said Wehnelt electrode 14 and anode 13. The lanthanum hexaboride cathode of this invention enables an electron beam image to be projected onto a target 4 with a far higher brightness than that afforded by the conventional tungsten filament cathode, thus making possible a sufficiently high target current for an electron beam apparatus in which the advantage of shaping the cross section of an electron beam with a limiting aperture 2 are fully exploitable.

Further, the single lanthanum hexaboride crystal cathode of this invention has an effective life about fifty times as long as that a conventional tungsten filament cathode. This invention has the further advantage that a single lanthanum hexaboride crystal cathode whose convex end portion has a <110> crystal orientation consumes less heating power than does the type having a <100> crystal orientation.

The advantages and favorable effects of this invention are supported by the following experimental results.

FIG. 3 shows, as a function of the bias resistance, changes in the brightness, beam divergence angle, and crossover diameter of the electron beam of an electron gun provided with a rod-shaped single lanthanum hexaboride crystal cathode which has a length of 1.5 mm, a cross sectional area of 0.6×0.8 mm, and a convex end portion with a <110> crystal orientation and a tip radius of 500 microns. In FIG. 3, Curve A denotes the beam brightness; Curve B the divergence angle; and Curve C the crossover diameter. As seen from FIG. 3, the beam divergence angle (Curve B) and crossover diameter (Curve C) remain substantially fixed relative to changes in the bias resistance. The brightness can be increased above $2 \times 10^5$ A/cm² str for bias resistances less than 2 MΩ. With the electron gun of this invention, therefore, electron beams are irradiated on the limiting aperture 2 with a uniform current density and high brightness.

FIG. 4 indicates how the image brightness, divergence angle, and crossover diameter variations of the electron beam of this invention change as functions of cathode tip radius. In FIG. 4, Curve D denotes the brightness of the electron beam image; Curve E variations in the beam crossover diameter; and Curve F the beam divergence angle. FIG. 4 shows that where the tip radius of the pointed end portion of the cathode is in the range between 260 and 1,000 microns, then an electron beam is produced which has a beam divergence angle as large as about 5 mrad and crossover diameter variations within a narrow range for about 5 microns. The data of FIG. 4, which was obtained by setting the bias resistance at 2.24 MΩ, remained substantially the same despite slight variation in the bias resistance. Clearly, FIG. 4 indicates that where the tip radius of the convex end portion of the cathode is in the range between 300 and 600 microns, then an electron beam is produced which has a particularly large beam divergence angle and a crossover diameter varying within a narrow range.

The above-mentioned experiments prove that with the electron gun of this invention, an electron beam having a sufficiently large beam divergence angle can be irradiated on the limiting aperture with a uniform current density. Further, the brightness of the electron beam can be enhanced by a factor of ten while the crossover diameter and beam divergence angle kept unchanged simply by varying the bias resistance. The electron gun of this invention has a far longer effective life than does the conventional type which is provided with a tungsten filament cathode. The invention produces a stable electron beam, ensuring the high brightness of an electron beam image and a high target current over a lengthy period of time.

This invention is not limited to the case where the convex end portion of the lanthanum hexaboride cathode has a crystal orientation of <110>. Even when the pointed end portion of said cathode has a crystal orientation of <100>, the invention produces satisfactory results. Further, the electron gun of the invention is also applicable to a variable shaped beam type electron beam projecting system using a plurality of limiting apertures. Finally, the invention can be practised in various modifications without departing from the object of the invention.

What we claim is:

1. An electron gun for a shaped-beam-type electron beam delineating system, comprising: a cathode including a single crystal of lanthanum hexaboride having a convex end portion with a tip radius ranging between 260 and 1,000 microns.

2. The electron gun according to claim 1, wherein the convex end portion of said cathode has a tip radius ranging between 300 and 600 microns.

3. The electron gun according to claim 1 or 2, wherein the convex end portion of said cathode has a crystal orientation of <110>.

* * * * *